US009445524B2

(12) United States Patent
Lofy et al.

(10) Patent No.: US 9,445,524 B2
(45) Date of Patent: Sep. 13, 2016

(54) SYSTEMS AND METHODS FOR THERMOELECTRICALLY COOLING INDUCTIVE CHARGING STATIONS

(71) Applicant: Gentherm Incorporated, Northville, MI (US)

(72) Inventors: John Lofy, Claremont, CA (US); David Marquette, Farmington Hills, MI (US)

(73) Assignee: Gentherm Incorporated, Northville, MI (US)

( * ) Notice: Subject to any disclaimer, the term of this patent is extended or adjusted under 35 U.S.C. 154(b) by 294 days.

(21) Appl. No.: 13/935,372

(22) Filed: Jul. 3, 2013

(65) Prior Publication Data

US 2014/0007594 A1 Jan. 9, 2014

Related U.S. Application Data

(60) Provisional application No. 61/668,897, filed on Jul. 6, 2012.

(51) Int. Cl.
*H05K 7/20* (2006.01)
*H02J 7/02* (2016.01)

(52) U.S. Cl.
CPC ........... *H05K 7/20136* (2013.01); *H02J 7/025* (2013.01); *H05K 7/20145* (2013.01); *H05K 7/20845* (2013.01)

(58) Field of Classification Search
CPC ............... H05K 7/20; H05K 7/20136; H05K 7/20845; H05K 7/20145
See application file for complete search history.

(56) References Cited

U.S. PATENT DOCUMENTS

| 2,991,628 A | 7/1961 | Tuck |
| 3,136,577 A | 6/1964 | Richard |

(Continued)

FOREIGN PATENT DOCUMENTS

| DE | 36 39 089 | 5/1988 |
| DE | 40 28 658 | 3/1991 |

(Continued)

OTHER PUBLICATIONS

Feher, Steve, Thermoelectric Air Conditioned Variable Temperature Seat (VTS) & Effect Upon Vehicle Occupant Comfort, Vehicle Energy Efficiency, and Vehicle Environment Compatibility, SAE Technical Paper, Apr. 1993, pp. 341-349.

(Continued)

*Primary Examiner* — Emmanuel Duke
(74) *Attorney, Agent, or Firm* — Knobbe, Martens, Olson & Bear, LLP

(57) ABSTRACT

In some embodiments, a cooling system for an induction charger includes a thermal conditioning module in fluid communication with an induction charging assembly, which includes a dock and an induction charging module. The dock can be configured to receive a portable electronic device, such as a cell phone, that is configured to accept inductive charging from the induction charging module. The thermal conditioning module can include a fan or other fluid encouraging assembly, ducting, and a thermoelectric device (e.g., a Peltier device). A fluid, such as air, can flow from the fan and across and/or through the thermoelectric device, thereby conditioning the fluid. The conditioned fluid can be provided to the dock to at least partially offset the heat generated by the inductive charging and/or the portable electronic device.

14 Claims, 8 Drawing Sheets

(56) References Cited

U.S. PATENT DOCUMENTS

| | | |
|---|---|---|
| 3,137,523 A | 6/1964 | Karner |
| 3,243,965 A | 4/1966 | Jepson |
| 3,310,953 A | 3/1967 | Rait |
| 3,314,242 A | 4/1967 | Lefferts |
| 3,434,302 A | 3/1969 | Stoner et al. |
| 3,713,302 A | 1/1973 | Reviel |
| 3,808,825 A | 5/1974 | Ciurea |
| 4,054,037 A | 10/1977 | Yoder |
| 4,089,436 A | 5/1978 | Marks |
| 4,274,262 A | 6/1981 | Reed et al. |
| 4,301,658 A | 11/1981 | Reed |
| 4,311,017 A | 1/1982 | Reed et al. |
| D264,592 S | 5/1982 | Reed et al. |
| 4,384,512 A | 5/1983 | Keith |
| 4,413,857 A | 11/1983 | Hayashi |
| 4,581,898 A | 4/1986 | Preis |
| 4,597,435 A | 7/1986 | Fosco, Jr. |
| 4,671,070 A | 6/1987 | Rudick |
| 4,671,567 A | 6/1987 | Frobose |
| 4,685,727 A | 8/1987 | Cremer et al. |
| 4,711,099 A | 12/1987 | Polan et al. |
| 4,738,113 A | 4/1988 | Rudick |
| 4,759,190 A | 7/1988 | Trachtenberg et al. |
| 4,870,837 A | 10/1989 | Weins |
| 4,914,920 A | 4/1990 | Carnagie et al. |
| 4,923,248 A | 5/1990 | Feher |
| 4,989,415 A | 2/1991 | Lombness |
| 5,002,336 A | 3/1991 | Feher |
| 5,042,258 A | 8/1991 | Sundhar |
| 5,051,076 A | 9/1991 | Okoma et al. |
| 5,060,479 A | 10/1991 | Carmi et al. |
| 5,077,709 A | 12/1991 | Feher |
| 5,106,161 A | 4/1992 | Meiller |
| 5,117,638 A | 6/1992 | Feher |
| D334,508 S | 4/1993 | Furtado |
| 5,230,016 A | 7/1993 | Yasuda |
| 5,283,420 A | 2/1994 | Montalto |
| 5,301,508 A | 4/1994 | Kahl et al. |
| 5,315,830 A | 5/1994 | Doke et al. |
| D350,048 S | 8/1994 | Kahl et al. |
| 5,367,879 A | 11/1994 | Doke et al. |
| 5,385,382 A | 1/1995 | Single, II et al. |
| D358,071 S | 5/1995 | Gill |
| 5,448,109 A | 9/1995 | Cachy |
| 5,572,872 A | 11/1996 | Hlavacek |
| 5,597,200 A | 1/1997 | Gregory et al. |
| 5,600,225 A * | 2/1997 | Goto ............... H02J 7/025 |
| | | 320/108 |
| 5,609,032 A | 3/1997 | Bielinski |
| 5,626,021 A | 5/1997 | Karunasiri et al. |
| 5,634,343 A | 6/1997 | Baker, III |
| 5,655,384 A | 8/1997 | Joslin, Jr. |
| 5,710,911 A | 1/1998 | Walsh et al. |
| 5,720,171 A | 2/1998 | Osterhoff et al. |
| 5,842,353 A | 12/1998 | Kuo-Liang |
| 5,845,499 A | 12/1998 | Montesanto |
| 5,850,741 A | 12/1998 | Feher |
| 5,862,669 A | 1/1999 | Davis et al. |
| 5,881,560 A | 3/1999 | Bielinski |
| 5,884,487 A | 3/1999 | Davis et al. |
| 5,887,304 A | 3/1999 | Von der Heyde |
| 5,921,314 A | 7/1999 | Schuller et al. |
| 5,924,766 A | 7/1999 | Esaki et al. |
| 5,927,817 A | 7/1999 | Ekman et al. |
| 5,934,748 A | 8/1999 | Faust et al. |
| 5,941,077 A | 8/1999 | Safyan |
| 5,946,939 A | 9/1999 | Matsushima et al. |
| 5,952,814 A * | 9/1999 | Van Lerberghe ......... 320/108 |
| 5,959,433 A * | 9/1999 | Rohde ............... H02J 7/025 |
| | | 320/108 |
| 5,970,719 A | 10/1999 | Merritt |
| 6,003,950 A | 12/1999 | Larsson |
| 6,019,420 A | 2/2000 | Faust et al. |
| 6,048,024 A | 4/2000 | Wallman |
| 6,059,018 A | 5/2000 | Yoshinori et al. |
| 6,062,641 A | 5/2000 | Suzuki et al. |
| 6,079,485 A | 6/2000 | Esaki et al. |
| 6,082,114 A | 7/2000 | Leonoff |
| 6,085,369 A | 7/2000 | Feher |
| 6,100,663 A * | 8/2000 | Boys ..................... B60L 11/182 |
| | | 320/108 |
| 6,103,967 A | 8/2000 | Cachy et al. |
| 6,105,384 A | 8/2000 | Joseph |
| 6,119,461 A | 9/2000 | Stevick et al. |
| 6,119,463 A | 9/2000 | Bell |
| 6,121,585 A | 9/2000 | Dam |
| 6,141,969 A | 11/2000 | Launchbury et al. |
| 6,145,925 A | 11/2000 | Eksin et al. |
| 6,186,592 B1 | 2/2001 | Orizaris et al. |
| 6,189,966 B1 | 2/2001 | Faust et al. |
| 6,192,787 B1 | 2/2001 | Montalto |
| 6,196,627 B1 | 3/2001 | Faust et al. |
| 6,206,465 B1 | 3/2001 | Faust et al. |
| 6,223,539 B1 | 5/2001 | Bell |
| 6,263,530 B1 | 7/2001 | Feher |
| 6,269,653 B1 | 8/2001 | Katuša |
| 6,282,906 B1 | 9/2001 | Cauchy |
| 6,308,519 B1 | 10/2001 | Bielinski |
| 6,396,241 B1 | 5/2002 | Ramos |
| 6,401,461 B1 | 6/2002 | Harrison et al. |
| 6,401,462 B1 | 6/2002 | Bielinski |
| 6,422,024 B1 | 7/2002 | Foye |
| 6,449,958 B1 | 9/2002 | Foye |
| D467,468 S | 12/2002 | Krieger et al. |
| 6,509,704 B1 | 1/2003 | Brown |
| 6,530,232 B1 | 3/2003 | Kitchens |
| 6,541,737 B1 | 4/2003 | Eksin et al. |
| RE38,128 E | 6/2003 | Gallup et al. |
| D475,895 S | 6/2003 | Ancona et al. |
| 6,571,564 B2 | 6/2003 | Upadhye et al. |
| 6,598,251 B2 | 7/2003 | Habboub et al. |
| 6,604,785 B2 | 8/2003 | Bargheer et al. |
| 6,606,866 B2 | 8/2003 | Bell |
| 6,619,736 B2 | 9/2003 | Stowe et al. |
| 6,626,488 B2 | 9/2003 | Pfahler |
| 6,644,735 B2 | 11/2003 | Bargheer et al. |
| 6,658,857 B1 | 12/2003 | George |
| 6,676,207 B2 | 1/2004 | Rauh et al. |
| 6,700,052 B2 | 3/2004 | Bell |
| 6,711,014 B2 * | 3/2004 | Anzai .................. G06F 1/18 |
| | | 320/108 |
| 6,732,533 B1 | 5/2004 | Giles |
| 6,732,534 B2 | 5/2004 | Spry |
| 6,761,399 B2 | 7/2004 | Bargheer et al. |
| 6,786,541 B2 | 9/2004 | Haupt et al. |
| 6,786,545 B2 | 9/2004 | Bargheer et al. |
| 6,808,230 B2 | 10/2004 | Buss et al. |
| 6,828,528 B2 | 12/2004 | Stowe et al. |
| 6,841,957 B2 | 1/2005 | Brown |
| 6,855,880 B2 | 2/2005 | Feher |
| 6,857,697 B2 | 2/2005 | Brennan et al. |
| 6,870,135 B2 | 3/2005 | Hamm et al. |
| 6,892,807 B2 | 5/2005 | Fristedt et al. |
| 6,893,086 B2 | 5/2005 | Bajic et al. |
| 6,907,739 B2 | 6/2005 | Bell |
| 6,918,257 B2 | 7/2005 | Slone et al. |
| 6,954,944 B2 | 10/2005 | Feher |
| 6,976,734 B2 | 12/2005 | Stoewe |
| 7,022,946 B2 | 4/2006 | Sanoner et al. |
| 7,040,710 B2 | 5/2006 | White et al. |
| 7,070,232 B2 | 7/2006 | Minegishi et al. |
| 7,082,773 B2 | 8/2006 | Cauchy |
| 7,089,749 B1 | 8/2006 | Schafer |
| 7,108,319 B2 | 9/2006 | Hartwich et al. |
| 7,114,771 B2 | 10/2006 | Lofy et al. |
| 7,124,593 B2 | 10/2006 | Feher |
| 7,131,689 B2 | 11/2006 | Brennan et al. |
| 7,147,279 B2 | 12/2006 | Bevan et al. |
| 7,168,758 B2 | 1/2007 | Bevan et al. |
| 7,178,344 B2 | 2/2007 | Bell |
| 7,201,441 B2 | 4/2007 | Stoewe et al. |
| 7,272,936 B2 | 9/2007 | Feher |
| 7,425,034 B2 | 9/2008 | Bajic et al. |
| 7,462,028 B2 | 12/2008 | Cherala et al. |

(56) References Cited

U.S. PATENT DOCUMENTS

| | | |
|---|---|---|
| 7,475,464 B2 | 1/2009 | Lofy et al. |
| 7,480,950 B2 | 1/2009 | Feher |
| 7,506,938 B2 | 3/2009 | Brennan et al. |
| 7,587,901 B2 | 9/2009 | Petrovski |
| 7,591,507 B2 | 9/2009 | Giffin et al. |
| 7,640,754 B2 | 1/2010 | Wolas |
| 7,665,803 B2 | 2/2010 | Wolas |
| 7,708,338 B2 | 5/2010 | Wolas |
| RE41,765 E | 9/2010 | Gregory et al. |
| 7,827,620 B2 | 11/2010 | Feher |
| 7,827,805 B2 | 11/2010 | Comiskey et al. |
| 7,862,113 B2 | 1/2011 | Knoll |
| 7,866,017 B2 | 1/2011 | Knoll |
| 7,877,827 B2 | 2/2011 | Marquette et al. |
| 7,937,789 B2 | 5/2011 | Feher |
| 7,963,594 B2 | 6/2011 | Wolas |
| 7,966,835 B2 | 6/2011 | Petrovski |
| 7,996,936 B2 | 8/2011 | Marquette et al. |
| 8,065,763 B2 | 11/2011 | Brykalski et al. |
| 8,104,295 B2 | 1/2012 | Lofy |
| 8,143,554 B2 | 3/2012 | Lofy |
| 8,181,290 B2 | 5/2012 | Brykalski et al. |
| 8,191,187 B2 | 6/2012 | Brykalski et al. |
| 8,222,511 B2 | 7/2012 | Lofy |
| 8,256,236 B2 | 9/2012 | Lofy |
| 8,332,975 B2 | 12/2012 | Brykalski et al. |
| 8,400,104 B2 * | 3/2013 | Adamczyk ............... H02J 7/025 320/108 |
| 8,402,579 B2 | 3/2013 | Marquette et al. |
| 8,418,286 B2 | 4/2013 | Brykalski et al. |
| 8,434,314 B2 | 5/2013 | Comiskey et al. |
| 8,438,863 B2 | 5/2013 | Lofy |
| RE44,272 E | 6/2013 | Bell |
| 8,460,816 B2 * | 6/2013 | Julstrom ................ H01F 38/14 429/121 |
| 8,472,976 B1 * | 6/2013 | Ledet .......................... 455/456.1 |
| 8,505,320 B2 | 8/2013 | Lofy |
| 8,516,842 B2 | 8/2013 | Petrovski |
| 8,539,624 B2 | 9/2013 | Terech et al. |
| 8,575,518 B2 | 11/2013 | Walsh |
| 8,621,687 B2 | 1/2014 | Brykalski et al. |
| 8,732,874 B2 | 5/2014 | Brykalski et al. |
| 8,782,830 B2 | 7/2014 | Brykalski et al. |
| 8,893,329 B2 | 11/2014 | Petrovski |
| 9,105,808 B2 | 8/2015 | Petrovski |
| 9,105,809 B2 | 8/2015 | Lofy |
| 9,121,414 B2 | 9/2015 | Lofy et al. |
| 9,125,497 B2 | 9/2015 | Brykalski et al. |
| 2002/0121096 A1 | 9/2002 | Harrison et al. |
| 2002/0162339 A1 | 11/2002 | Harrison et al. |
| 2003/0039298 A1 | 2/2003 | Eriksson et al. |
| 2003/0145380 A1 | 8/2003 | Schmid |
| 2004/0068992 A1 | 4/2004 | Cauchy |
| 2004/0090093 A1 | 5/2004 | Kamiya et al. |
| 2004/0194470 A1 | 10/2004 | Upadhye et al. |
| 2004/0255364 A1 | 12/2004 | Feher |
| 2005/0162824 A1 * | 7/2005 | Thompson ................ 361/686 |
| 2005/0274118 A1 | 12/2005 | McMurry et al. |
| 2005/0285438 A1 | 12/2005 | Ishima et al. |
| 2006/0053529 A1 | 3/2006 | Feher |
| 2006/0053805 A1 | 3/2006 | Flinner et al. |
| 2006/0061325 A1 * | 3/2006 | Tang ................ H02J 7/025 320/108 |
| 2006/0070384 A1 | 4/2006 | Ertel |
| 2006/0087160 A1 | 4/2006 | Dong et al. |
| 2006/0117760 A1 | 6/2006 | Pieronczyk et al. |
| 2006/0117761 A1 | 6/2006 | Bormann |
| 2006/0130491 A1 | 6/2006 | Park et al. |
| 2006/0131325 A1 | 6/2006 | Wauters et al. |
| 2006/0137099 A1 | 6/2006 | Feher |
| 2006/0137358 A1 | 6/2006 | Feher |
| 2006/0150637 A1 | 7/2006 | Wauters et al. |
| 2006/0214480 A1 | 9/2006 | Terech |
| 2006/0244289 A1 | 11/2006 | Bedro |
| 2006/0273646 A1 | 12/2006 | Comiskey et al. |
| 2007/0086757 A1 | 4/2007 | Feher |
| 2007/0152633 A1 | 7/2007 | Lee |
| 2007/0200398 A1 | 8/2007 | Wolas et al. |
| 2007/0214799 A1 | 9/2007 | Goenka |
| 2007/0251016 A1 | 11/2007 | Feher |
| 2007/0262621 A1 | 11/2007 | Dong et al. |
| 2007/0277313 A1 | 12/2007 | Terech |
| 2008/0000025 A1 | 1/2008 | Feher |
| 2008/0047598 A1 | 2/2008 | Lofy |
| 2008/0087316 A1 | 4/2008 | Inaba et al. |
| 2008/0143152 A1 * | 6/2008 | Wolas ................ 297/180.14 |
| 2008/0164733 A1 | 7/2008 | Giffin et al. |
| 2008/0166224 A1 | 7/2008 | Giffin et al. |
| 2008/0173022 A1 | 7/2008 | Petrovski |
| 2009/0000031 A1 | 1/2009 | Feher |
| 2009/0015027 A1 | 1/2009 | Lambarth et al. |
| 2009/0025770 A1 | 1/2009 | Lofy |
| 2009/0026813 A1 | 1/2009 | Lofy |
| 2009/0033130 A1 | 2/2009 | Marquette et al. |
| 2009/0096413 A1 | 4/2009 | Partovi et al. |
| 2009/0126110 A1 | 5/2009 | Feher |
| 2009/0139781 A1 | 6/2009 | Straubel |
| 2009/0158751 A1 | 6/2009 | Yu et al. |
| 2009/0211619 A1 | 8/2009 | Sharp et al. |
| 2009/0218855 A1 | 9/2009 | Wolas |
| 2009/0298553 A1 | 12/2009 | Ungari et al. |
| 2010/0193498 A1 | 8/2010 | Walsh |
| 2010/0290215 A1 | 11/2010 | Metcalf et al. |
| 2011/0015652 A1 | 1/2011 | Sladecek |
| 2011/0115635 A1 | 5/2011 | Petrovski et al. |
| 2011/0253340 A1 | 10/2011 | Petrovski |
| 2011/0260681 A1 | 10/2011 | Guccione et al. |
| 2011/0267769 A1 | 11/2011 | Nakamura et al. |
| 2011/0271994 A1 | 11/2011 | Gilley |
| 2012/0080911 A1 | 4/2012 | Brykalski et al. |
| 2012/0114512 A1 | 5/2012 | Lofy et al. |
| 2012/0117730 A1 | 5/2012 | Lemire et al. |
| 2012/0131748 A1 | 5/2012 | Brykalski et al. |
| 2012/0228904 A1 | 9/2012 | Mouradian |
| 2012/0235501 A1 | 9/2012 | Kesler et al. |
| 2012/0261399 A1 | 10/2012 | Lofy |
| 2012/0319439 A1 | 12/2012 | Lofy |
| 2013/0086923 A1 | 4/2013 | Petrovski et al. |
| 2013/0097776 A1 | 4/2013 | Brykalski et al. |
| 2013/0097777 A1 | 4/2013 | Marquette et al. |
| 2013/0198954 A1 | 8/2013 | Brykalski et al. |
| 2013/0206852 A1 | 8/2013 | Brykalski et al. |
| 2013/0227783 A1 | 9/2013 | Brykalski et al. |
| 2013/0234656 A1 * | 9/2013 | Lambert ............... H02J 7/0042 320/108 |
| 2013/0239592 A1 | 9/2013 | Lofy |
| 2013/0278075 A1 | 10/2013 | Kurs et al. |
| 2014/0026320 A1 | 1/2014 | Marquette et al. |
| 2014/0030082 A1 | 1/2014 | Helmenstein |
| 2014/0062392 A1 | 3/2014 | Lofy et al. |
| 2014/0090513 A1 | 4/2014 | Zhang et al. |
| 2014/0090829 A1 | 4/2014 | Petrovski |
| 2014/0130516 A1 | 5/2014 | Lofy |
| 2014/0131343 A1 | 5/2014 | Walsh |
| 2014/0159442 A1 | 6/2014 | Helmenstein |
| 2014/0180493 A1 | 6/2014 | Csonti et al. |
| 2014/0187140 A1 | 7/2014 | Lazanja et al. |
| 2014/0194959 A1 | 7/2014 | Fries et al. |
| 2014/0237719 A1 | 8/2014 | Brykalski et al. |
| 2014/0250918 A1 | 9/2014 | Lofy |
| 2014/0260331 A1 | 9/2014 | Lofy et al. |
| 2014/0305625 A1 | 10/2014 | Petrovski |
| 2014/0310874 A1 | 10/2014 | Brykalski et al. |
| 2014/0338366 A1 | 11/2014 | Adldinger et al. |
| 2015/0013346 A1 | 1/2015 | Lofy |

FOREIGN PATENT DOCUMENTS

| | | |
|---|---|---|
| DE | 10238552 | 8/2001 |
| DE | 101 01 028 | 7/2002 |
| DE | 10115242 | 10/2002 |
| GB | 2 390 586 | 1/2004 |
| JP | 10-297243 | 11/1998 |
| JP | 11-098705 | 4/1999 |

(56) References Cited

FOREIGN PATENT DOCUMENTS

| JP | 2003-211941 | | | 7/2003 |
|---|---|---|---|---|
| JP | 2003-254636 | | | 9/2003 |
| JP | 2012-044064 | | | 3/2012 |
| JP | 2012044064 | A | * | 3/2012 |
| KR | 10-2007-0080057 | | | 8/2007 |
| WO | WO 02/11968 | | | 2/2002 |
| WO | WO 02/20292 | | | 3/2002 |
| WO | WO 03/014634 | | | 2/2003 |
| WO | WO 03/051666 | | | 6/2003 |
| WO | WO 2007/089789 | | | 8/2007 |
| WO | WO 2009/036077 | | | 3/2009 |
| WO | WO 2010/026805 | | | 3/2010 |
| WO | WO 2014/008423 | | | 1/2014 |
| WO | WO 2014/151493 | | | 9/2014 |
| WO | WO 2015/191819 | | | 12/2015 |

OTHER PUBLICATIONS

Lofy, J. et al., Thermoelectrics for Environmental Control in Automobiles, Proceeding of Twenty-First International Conference on Thermoelectrics (ICT 2002), published 2002, pp. 471-476.

* cited by examiner

SYSTEMS AND METHODS FOR THERMOELECTRICALLY COOLING INDUCTIVE CHARGING STATIONS

CROSS-REFERENCE TO RELATED APPLICATIONS

This application claims the priority benefit under 35 U.S.C. §119(e) of U.S. Provisional Application No. 61/668,897, filed Jul. 6, 2012, the entirety of which is hereby incorporated by reference.

BACKGROUND

1. Field

This application relates to a cooling device and, in some embodiments, to a thermoelectrically cooled inductive charging station, such as for charging a cell phone, and components thereof.

2. Description of the Related Art

Portable electronic devices (PEDs), such as cell phones, music players, sound recorders, computers (e.g., tablets), radios, watches, and otherwise, generally require power for operation. As such, many PEDs include a rechargeable battery or other rechargeable power source, thereby allowing for the device to be powered and readily transported without being limited by the length of electrical power cords or the like. In some instances, the charging of PEDs is accomplished with a physical electrical connection, such as a plug or other electrical connection that is connected with the device during charging and then disconnected when charging is complete. However, such connections are inconvenient due to the requirement of connecting and disconnecting the physical electrical connection.

Some PEDs avoid the need for such a physical electrical connection by being configured to accept inductive charging. Inductive charging uses electromagnetic fields to transfer power from a base (e.g., a dock) to a receiver (e.g., the power source in the PED) that is in close proximity to the base. As power is transferred via the electromagnetic fields, a physical electrical connection between the base and the receiver is not required, thus eliminating the inconvenience associated with connecting and disconnecting the physical electrical connection.

SUMMARY OF THE DISCLOSURE

Recently, it has been proposed to provide certain vehicles (e.g., cars, trucks, tractors, airplanes, boats, and otherwise) with an inductive charging station for PEDs. Such a design can allow users to place their PED in a dock (e.g., a pad, recess, slot, or otherwise) that has inductive charging functionality, thereby providing inductive charging of the PED without the inconvenience of a connecting and disconnecting a physical electrical connection.

One of the byproducts of inductive charging is heat, which can be unwanted in certain situations. For example, heat generated by inductive charging may place an additional load on the heating, ventilating, and air-conditioning system of the vehicle, which can result in decreased performance and/or reduced fuel economy. Further, heat produced by inductive charging may raise the temperature of the PED, which can degrade the performance of the PED and/or make the PED uncomfortable to use. For example, raising the temperature of a cell phone may make the phone uncomfortable to hold and/or to press against the user's ear.

Accordingly, for various reasons, it can be beneficial to cool the inductive charging station. In some embodiments, the inductive charging station is cooled by a thermoelectric device (TED), which has a hot side (also known as the waste side) and a cold side. A waste side heat exchanger can be thermally coupled to the hot side of the TED. Certain embodiments include a pump or fan to promote convective heat transfer from the cool side to the inductive charging station or the PED. In some implementations, the pump or fan also promotes convective heat transfer through the waste side heat exchanger. In some embodiments, air exits the waste side of the TED into a space in which the TED resides. In other embodiments, air exits the waste side of the TED and is ducted elsewhere, such as outside the vehicle.

DETAILED DESCRIPTION

Figure 1:
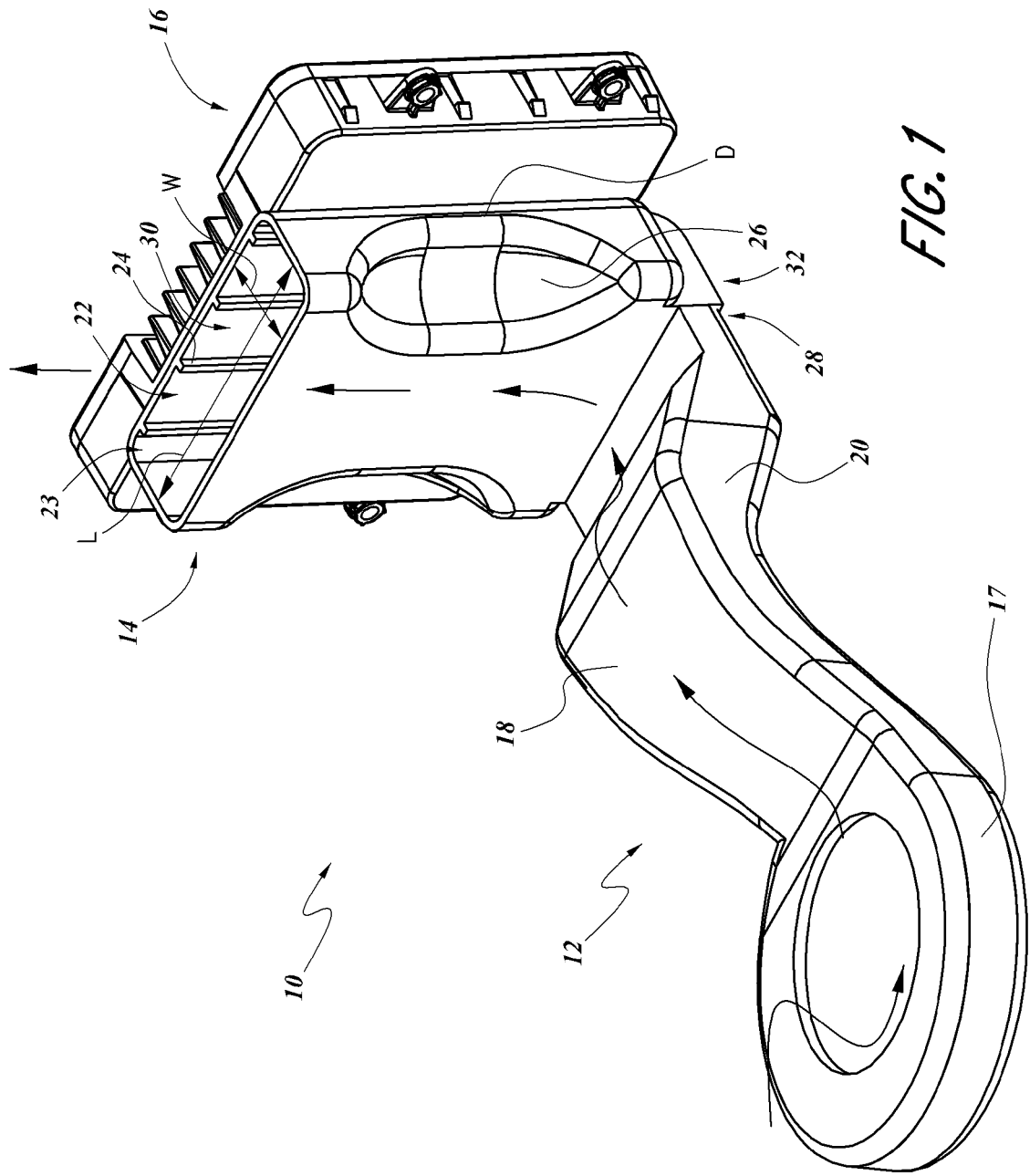
FIG. 1 illustrates a perspective view of an embodiment of a cooling system for an induction charger with a thermal conditioning module connected with a dock.
Figure 4:
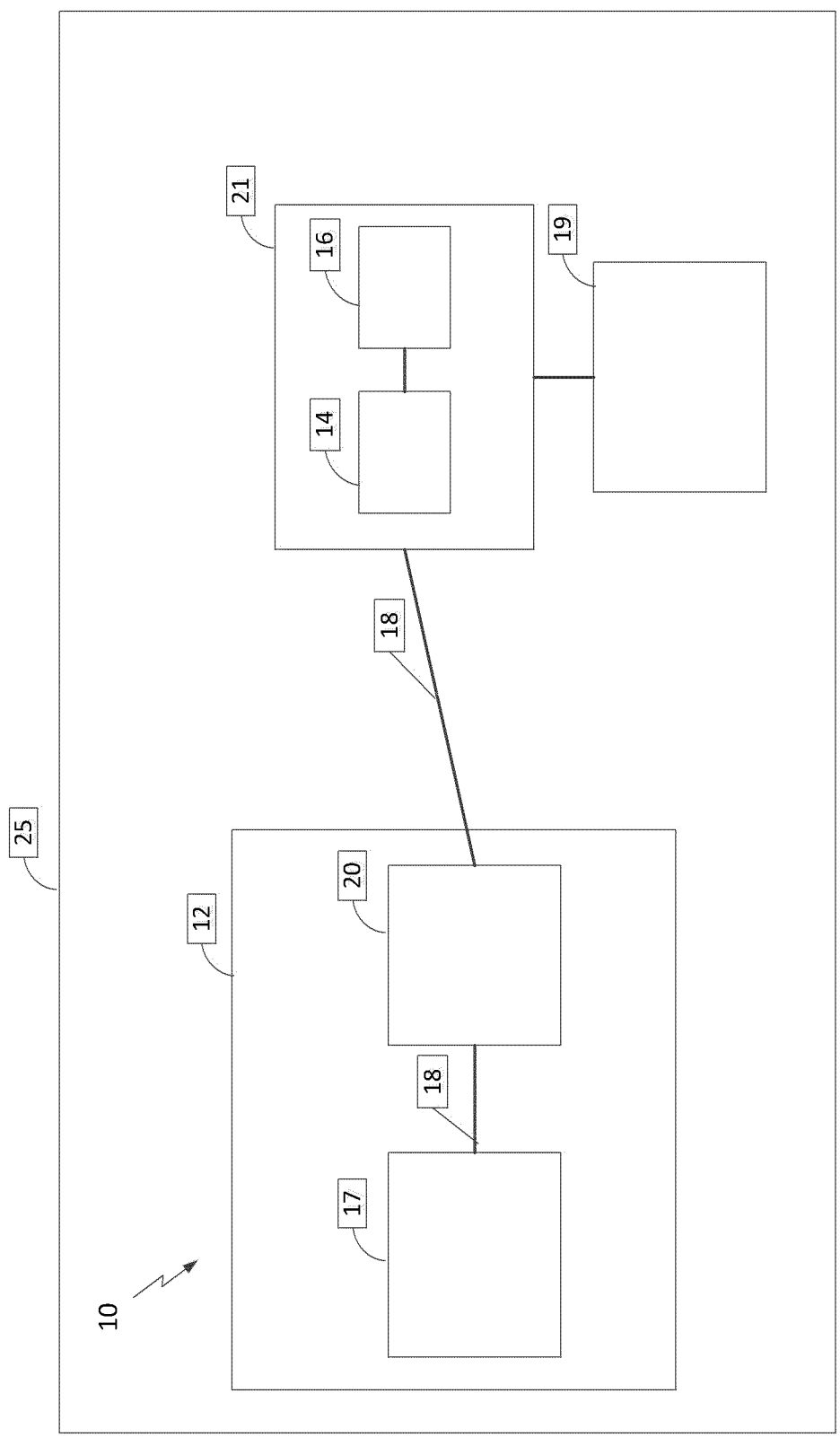
FIG. 4 illustrates a schematic view of a cooling system for an inductive charger according to an embodiment.

With reference to FIGS. 1 and 4, in some embodiments, a cooling system for an induction charger 10 includes a thermal conditioning module 12 in fluid communication with an induction charging assembly 21, which includes a dock 14 (e.g., a pad, recess, slot, opening, and/or the like) and an induction charging module 16. As shown, the induction charging module 16 can be mounted on, near, or adjacent the dock 14 so as to provide inductive charging functionality to PEDs, such as PED 19 (e.g., smartphones, other mobile phones, music playing devices, tablets, personal digital assistants (PDAs), etc.) that are configured to accept inductive charging and are placed in and/or on the dock 14.

In some embodiments, the thermal conditioning module 12 includes one more of the following: a fluid transfer device (such as, e.g., a pump, blower, or fan 17), ducting 18 (e.g., a fluid line, coupling, piping, etc.) thermal conditioning devices 20 (e.g., thermoelectric devices (TEDs), conductive heat transfer devices, other cooling or ventilation devices, etc.), sensors (e.g., temperature sensors, humidity sensors, condensation sensors, etc.), timers and/or the like. Any of various types of fluid transfer devices 17 (e.g., fans) can be used in such modules or devices, such as radial fans (e.g., squirrel cage fans), axial fans, propeller fans, and/or the like.

In certain embodiments, the fluid transfer device 17 is configured to draw air from near a floor or lower portion of the vehicle, which can be beneficial because such air may be cooler than air originating from other locations of the vehicle (e.g., due to a reduction in sun loading or otherwise). As illustrated, the ducting 18 can be in fluid communication with the fan 17 or other fluid transfer device. In addition, depending on the configuration of the module, such components can also be in fluid communication with a thermal conditioning device 20 (e.g., TED), the dock 14, one or more sensors, and/or any other components or devices, as desired or required. In some variants, the ducting 18 is in fluid communication with the dock 14 via an opening 28 in the dock 14. Certain implementations include the fan 17 and TED 20 in a single housing. However, in alternative embodiments, one or more components can be included in separate (e.g., adjacent or non-adjacent) housing or casings.

As noted above, the thermal conditioning device 20 can comprise a TED, for example, a Peltier device, which can include at least one pair of dissimilar materials connected electrically in series and thermally in parallel. In some embodiments, the dissimilar materials are mounted between a pair of plates positioned on the cold and hot sides of the device. The plates can provide for heat conduction and electrical insulation. A thermal interface material (e.g., grease, pad, or solder) can be used to conductively couple the cold or hot side plate to a conduction member, such as fins or the like. Fluid, such as air, can be passed over the conduction member to transfer heat by convection. In other embodiments, one or more intermediate elements (e.g., conduction elements) can be provided between the plates and the conduction element and/or the dock 14, thereby transferring heat between the TED 20 and the dock 14 by conduction.

In some embodiments, the dissimilar materials comprise a series of n-type and p-type semiconductor elements that are connected electrically in series and thermally in parallel. An electrical circuit is configured to pass current through the dissimilar materials so as to selectively create a cooled (and an oppositely oriented heated) side. Depending on the direction of electrical current passing through the thermoelectric device, one side of the device will be heated and the opposing side will be cooled.

In some embodiments, a controller (not shown) controls the operation of the thermal conditioning module 12. For example, the controller can allow the user to regulate when the thermal conditioning module 12 is activated and deactivated. In some embodiments, the controller receives an input from a sensor (e.g., a temperature sensor, a humidity sensor, a condensation sensor, etc.), which can be used in a control algorithm that helps regulate the operation (e.g., on or off, duty cycle, etc.) of the thermal conditioning device 20 (e.g., TED). Such an algorithm can be configured to provide for a desired cooling effect for the module, for fault protection, safety reasons, and/or the like. In certain variants, the controller is configured to communicate with, or receive signals from, other systems of the vehicle. For example, the controller can be in data communication with a signal that is indicative of whether the vehicle is in operation (e.g., the ignition has been activated), an occupant is positioned in the vehicle, and/or the like. Thus, in some such embodiments, the controller can be configured to allow the thermal conditioning module 12 to operate only if certain conditions are met (e.g., the vehicle is operating, an occupant is positioned in an adjacent seat, temperature/humidity levels are within a specific range, etc.). Electrical power from the vehicle's electrical system can be provided to the controller, fluid transfer device 17 (e.g., fan or blower), TED or other thermal conditioning device 20, sensors and/or any other components via electrical wires and/or some other direct or indirect electrical connection (not shown).

In some embodiments, the dock 14 is sized, shaped and otherwise configured to accept a PED. For example, the dock 14 can be configured to contain, hold, and/or embrace the PED. Such a configuration can provide a place to store the PED, which can be helpful in restricting, partially or completely, inadvertent movement of the PED during operation of the vehicle (e.g., while driving). In certain embodiments, the dock 14 is configured such that a cell phone or other PED can be slidingly inserted into and removed from the dock 14. Some implementations have the dock 14 positioned in a dashboard or center console of an automobile, although various other locations are contemplated as well (e.g., in or near a door, a glove box or other storage container, an armrest, a rear seat console and/or the like).

Some embodiments of the dock 14 comprise a cavity 22, which can be sized, shaped and otherwise configured to receive a PED. For example, the cavity 22 can include an aperture 23 through which a cell phone or other PED can be inserted. In some embodiments, the aperture 23 has a width W and a length L that are sized and otherwise configured such that a cell phone or other PED can be inserted through the aperture 23 and at least partially into the cavity 22. Some variants of the aperture 23 have a length L of at least about: 2.0 inches, 2.5 inches, 2.75 inches, 3.0 inches, 3.25 inches, values in between, or otherwise. Some embodiments of the aperture 23 have a width W of at least about: 0.25 inches, 0.38 inches, 0.50 inches, 0.62 inches, values in between, or otherwise. In other embodiments, however, the aperture can be sized and configured to accommodate a PED having a length and/or width greater than indicated above. For example, the aperture can be configured to receive a tablet or other relatively large PED therein. In certain implementations, the cavity 22 is in fluid communication with the ambient environment surrounding the dock 14. In some embodiments, the cavity 22 can be configured to receive at least about 75% (e.g., about 70%, 72%, 74%, 76%, 78%, 80%, ranges between the foregoing percentages) of the volume of a cell phone or other PED. In other embodiments, however, the cavity 22 can be configured to receive greater than about 80% of the PED (e.g., about 80%, 85%, 90%, 95%, 100%, values between the foregoing percentages, etc.) or less than about 70% of the PED (e.g., about 40%, 45%, 50%, 55%, 60%, 65%, 70%, values between the foregoing percentages, less than about 40%, etc.), as desired or required. In some embodiments, the cavity 22 has a volume of at least about 4 cubic inches.

Some embodiments of the cavity 22 are configured to receive all or a substantial portion of the longitudinal length of a cell phone or other PED. Such a configuration can, for example, facilitate securing and/or concealing (e.g., partially or completely) the cell phone or other PED. Certain embodiments of the cavity 22 have a depth D (also called a height) of at least about: 3.0 inches, 3.5 inches, 4.0 inches, 4.5 inches, 5.0 inches, values in between, or otherwise. In some embodiments, the cavity 22 is configured to receive only a portion of the longitudinal length of a PED, thereby providing a region, portion, or section (e.g., the portion of the PED that is not received in the cavity 22) to grasp to facilitate moving or otherwise handling (e.g., removing) the PED relative to the cavity 22. In other embodiments, the cavity 22 is configured to receive the entire or substantially the entire longitudinal length of the PED.

In some embodiments, the dock 14 comprises one or more stabilizing members, such as, for example, ribs or other protruding members 24. In some variants, the ribs 24 protrude at least partially into the cavity 22 and are configured to contact a PED that is inserted into the cavity 22, thereby reducing or restricting vibration and/or other movement of the PED relative to the dock 14. In some embodiments, the ribs 24 comprise one or more resilient materials, such rubber, plastic and/or the like. The ribs or other protruding members 24 can comprise one or more other materials and/or components, either in addition to or in lieu of plastic and/or rubber, as desired or required. For example, the ribs can include one or more springs or other resilient members or materials. Certain variants of the ribs have a length (parallel to L) of less than or equal to about 2.0 mm. In some embodiments, the ribs 24 extend along generally the entire depth of the dock 14. In some embodiments, the ribs 24 are configured to promote fluid flow when a PED is installed in the cavity 22, as will be discussed in further detail below. As shown, certain variants of the dock 14 include sculpted or other special features, such as shoulders 26, which also can be configured to facilitate stabilization and/or securement (e.g., grasping) of a PED that is inserted into the cavity 22. Some variants of the shoulders 26 include curves or angles so as to direct a PED into general alignment with the dock 14 during installation of the PED into the dock 14.

During operation of the cooling system for an induction charger 10, and as indicated by the arrows in FIG. 1, fluid (e.g., air) enters the fluid transfer device 17 (e.g., fan, blower, etc.) via an upper or lower aperture, and is encouraged into the ducting 18. The air passes over and/or through the thermal conditioning device 20 (e.g., TED), causing heat transfer between the thermal conditioning device 20 and the air or other fluid passing through or near it, thereby decreasing the temperature of the air or fluid. In some embodiments, the cooled air is directed, at least partially, into the dock 14. In certain implementations, the cooled air travels at least partially along at least some of depth of the dock 14, and along some, substantially all, or all of the height of the PED positioned within the dock. Accordingly, heat from the inductive charging assembly and/or PED can be advantageously transferred via convection to the cooled air (e.g., to cool the air), thereby transferring heat away from the PED and at least partially offsetting the heat generated by the inductive charging assembly and/or PED. The air can emerge from the dock 14 into the ambient environment of the vehicle. In some embodiments, such discharged air can be routed to one or more portions of the vehicle (e.g., the exterior of the vehicle, below or away from the console or seat assembly, etc.), as desired or required.

As noted above, in some embodiments, the dock 14 comprises one or more ribs or other protruding members 24, which can be configured to promote fluid flow even when a PED is positioned at least partially in the dock 14. In some embodiments, the ribs 24 are positioned and otherwise configured to at least partially define and maintain one or more channels 30. Thus, when a PED is positioned in the dock 14, a substantial volume of the cavity 22 may be occupied by the PED, thus restricting fluid flow. However, the ribs 24 and the corresponding channels 30 that they help define can be configured to maintain a space between the PED and a wall of the dock 14, and thus maintain a path through which air or other fluid may pass. In some embodiments, a bottom end 32 of the dock 14 (e.g., the portion which is adjacent or near a lower portion a PED that is positioned within the dock 14) comprises one or more ribs, dimples, grooves, protruding member and/or other features configured to promote airflow between the bottom of the PED and the bottom end 32 of the dock 14. One or more spaces between the PED and certain adjacent portions of the dock can advantageously promote the cooling effect on the PED when the system is in use.

Figure 1B:
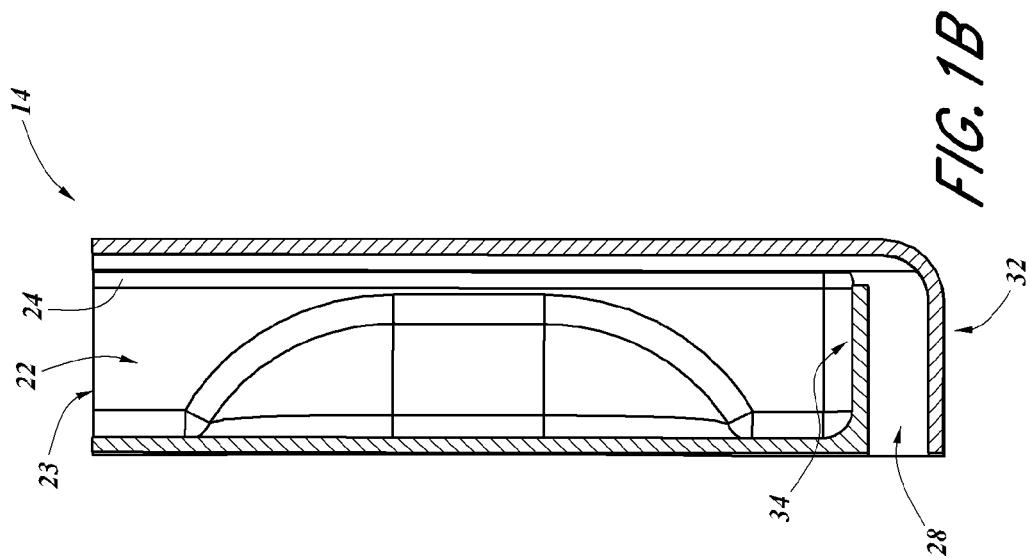
FIG. 1B illustrates a cross-sectional view of the dock of FIG. 1A taken along the line 1B-1B.
Figure 1A:
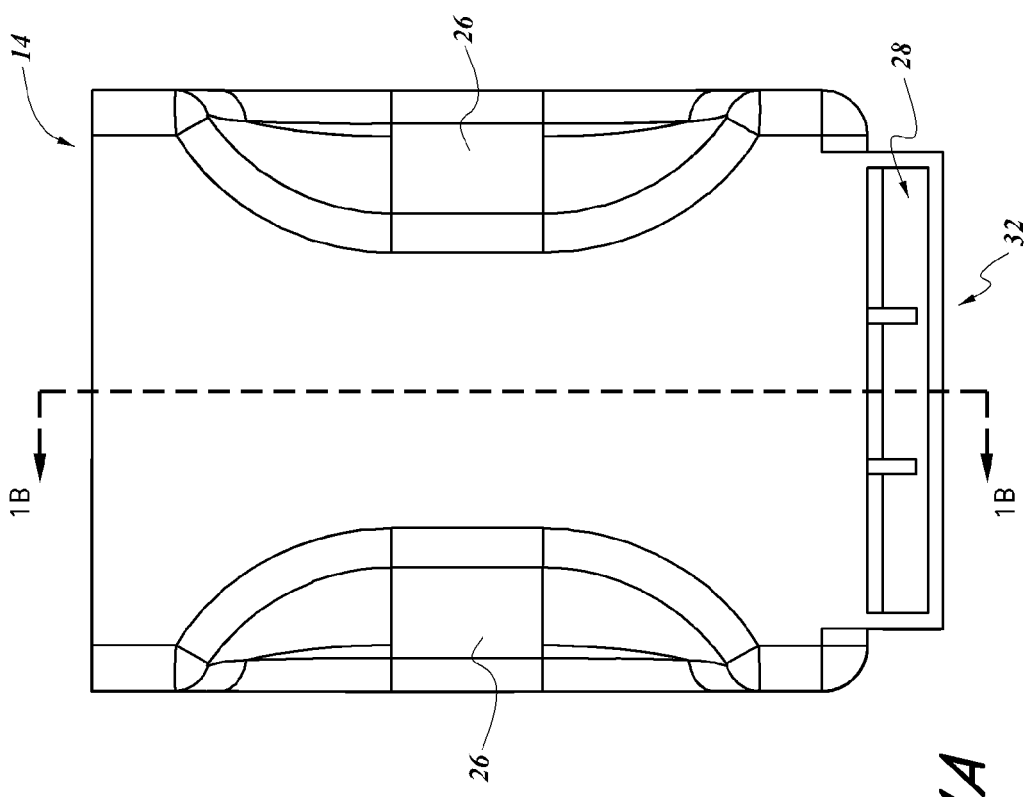
FIG. 1A illustrates a front view of the dock of FIG. 1.

In certain embodiments, such as is shown in FIGS. 1, 1A, and 1B, air from the fluid transfer device is configured to enter at or near the bottom end 32 of the dock 14. In such embodiments, the opening 28 in the dock 14 can be positioned at or near the bottom end 32. As illustrated in FIG. 1B, the dock 14 can include a support member 34 that extends from one generally vertical wall of the dock 14 toward an opposite generally vertical wall. In some implementations, the support member is configured to receive the bottom of a PED that is received in the dock 14. As shown, the support member 34 can be disposed a particular distance apart from the bottom end 32, thus the support member 34 can space the PED away from the bottom end 32 to facilitate airflow underneath the PED. In certain embodiments, the support member directs air toward one or more of the channels 30. As discussed herein, in at least some configurations, such spaces, channels, and other features can further facilitate in promoting efficient and effective cooling of a PED.

Figure 2:
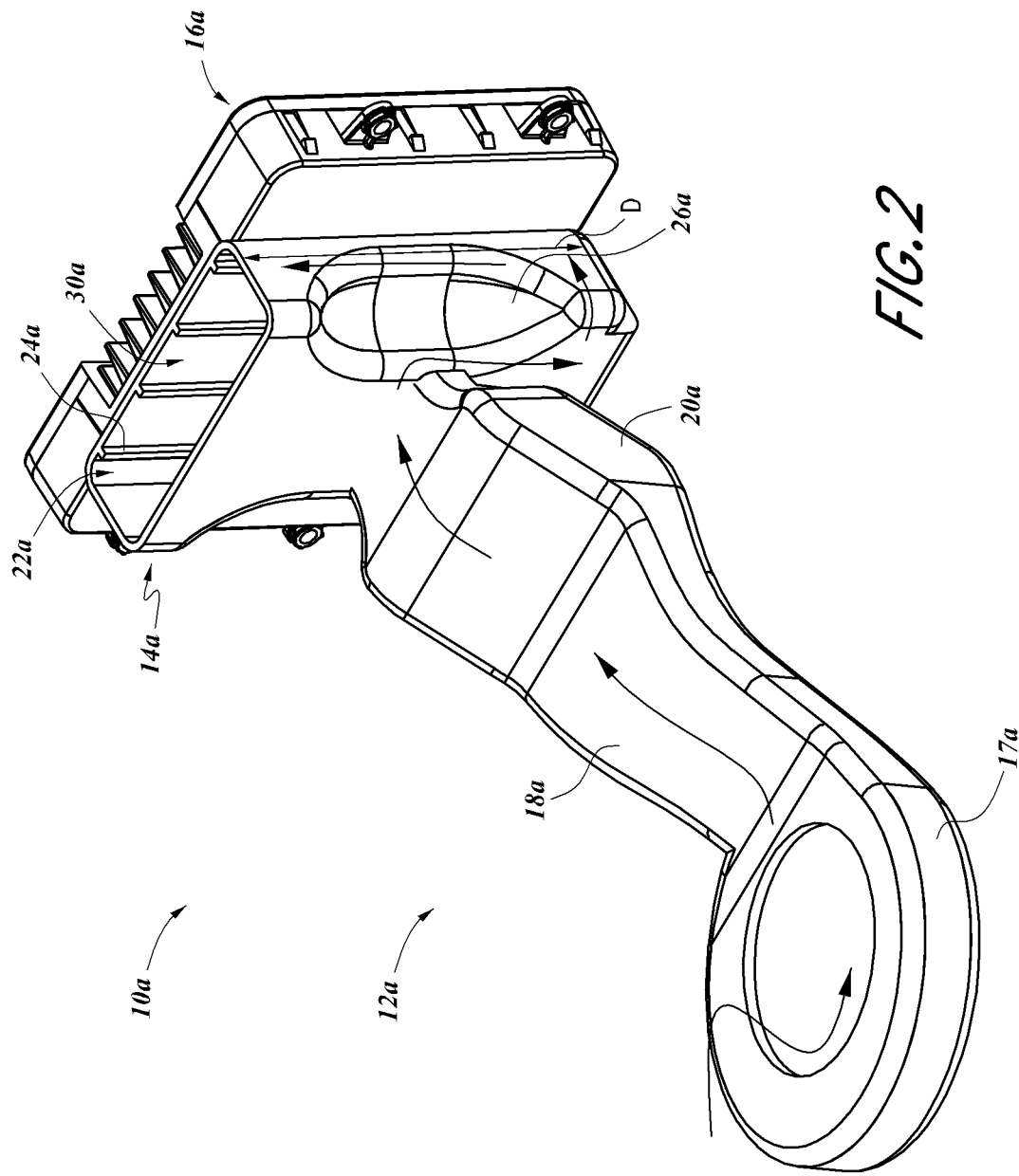
FIG. 2 illustrates a perspective view of another embodiment of a cooling system for an induction charger with a thermal conditioning module connected with a dock.
Figure 2B:
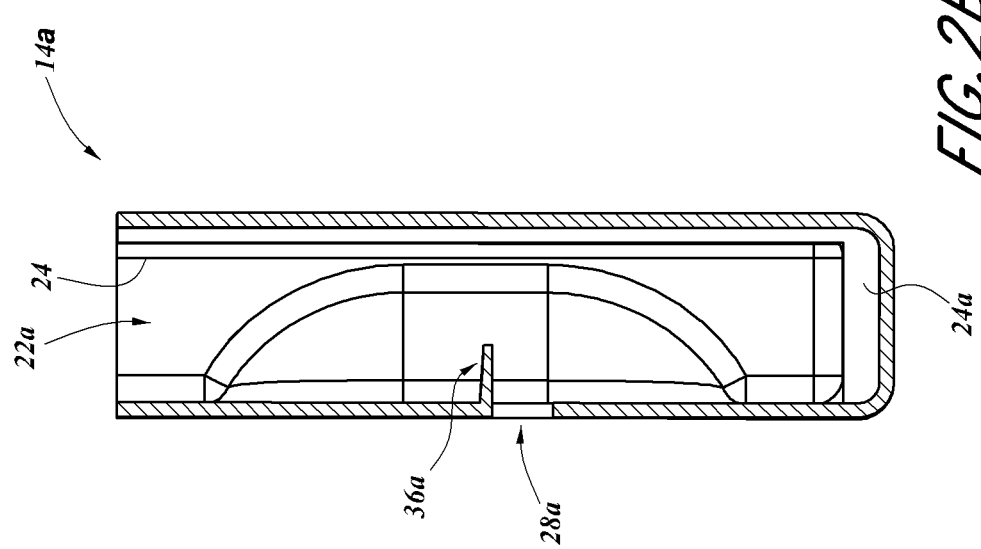
FIG. 2B illustrates a cross-sectional view of the dock of FIG. 2A taken along the line 2B-2B.
Figure 2A:
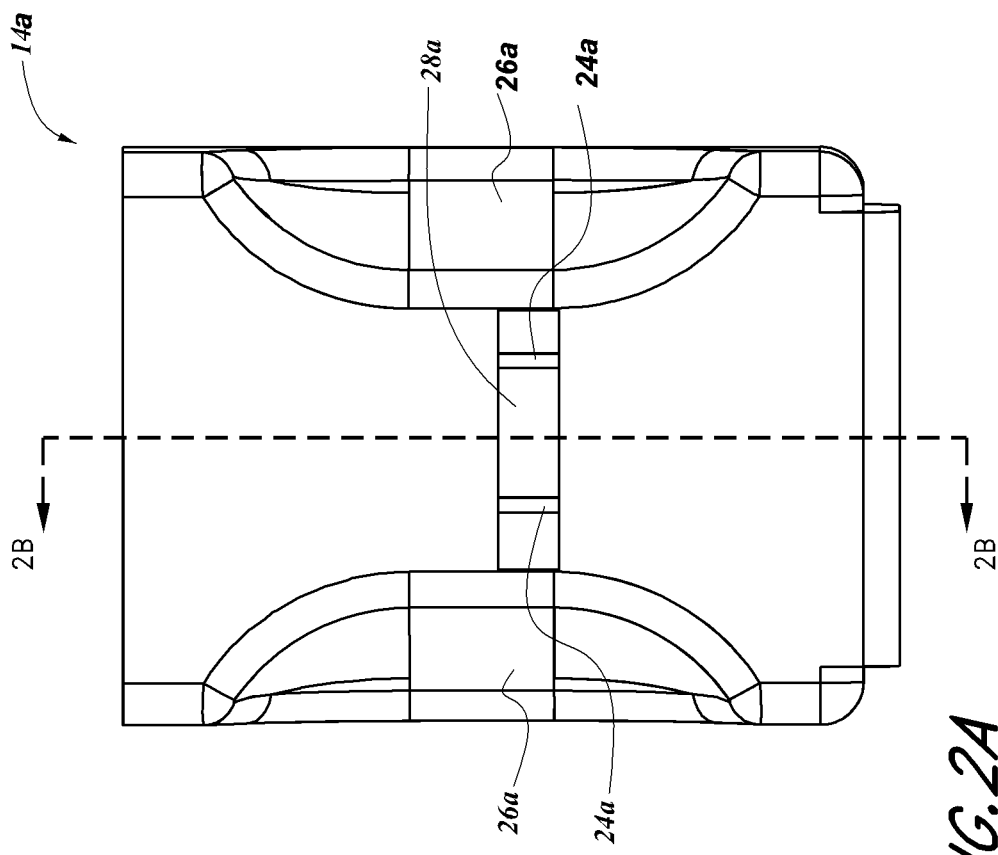
FIG. 2A illustrates a front view of the dock of FIG. 2.

FIGS. 2, 2A, and 2B illustrate another embodiment of a cooling system for an induction charger 10a. Several features and components of the cooling system for an induction charger 10a illustrated therein are identical or similar in form and function to those described above with respect to the cooling system for an induction charger 10, and have been provided with like numerals, with the addition of "a." Any features and/or components of the disclosed embodiments can be combined or used interchangeably.

In some embodiments, air or other fluid enters the dock 14a at a location between the top and bottom end 32a of the dock 14a. For example, the opening 28a can be located about half-way along the depth D of the dock 14a. Such a configuration can, for example, reduce the likelihood of spilled liquids or debris migrating into the fan 17a, ducting 18a, thermal conditioning device 20a (e.g., TED), other electrical and/or other. Sensitive components. For example, as the opening 28a is disposed a distance above the bottom end 32a, spilled liquid (such as water, coffee, soft drinks, etc.) or debris (such as crumbs, other food items, dust, dirt, lint, etc.) can be contained in the bottom end 32a, thereby facilitating clean-up and inhibiting such spills from entering the fan 17a, ducting 18a, and/or thermal conditioning device 20a.

As illustrated in FIG. 2B, the dock 14a can include one or more vanes 36a, which can be positioned near or adjacent the opening 28a. In certain embodiments, the vane 36a extends partly from one wall of the dock 14a and is configured to provide a desired space between the vane 36a and the opposite wall such that a PED can be inserted therebetween. In some variants, the vane 36a is configured to at least partially direct fluid flow, as desired or required. For example, the vane 36a can direct some or all of the fluid (e.g., air) passing through the opening 28a toward the bottom end 32a. As shown, the ribs or other protruding members 24a can extend along the bottom end 32a, thereby providing an elevated support surface on which the PED can rest while allowing the fluid to flow under the PED and through the channels 30a.

Figure 3:
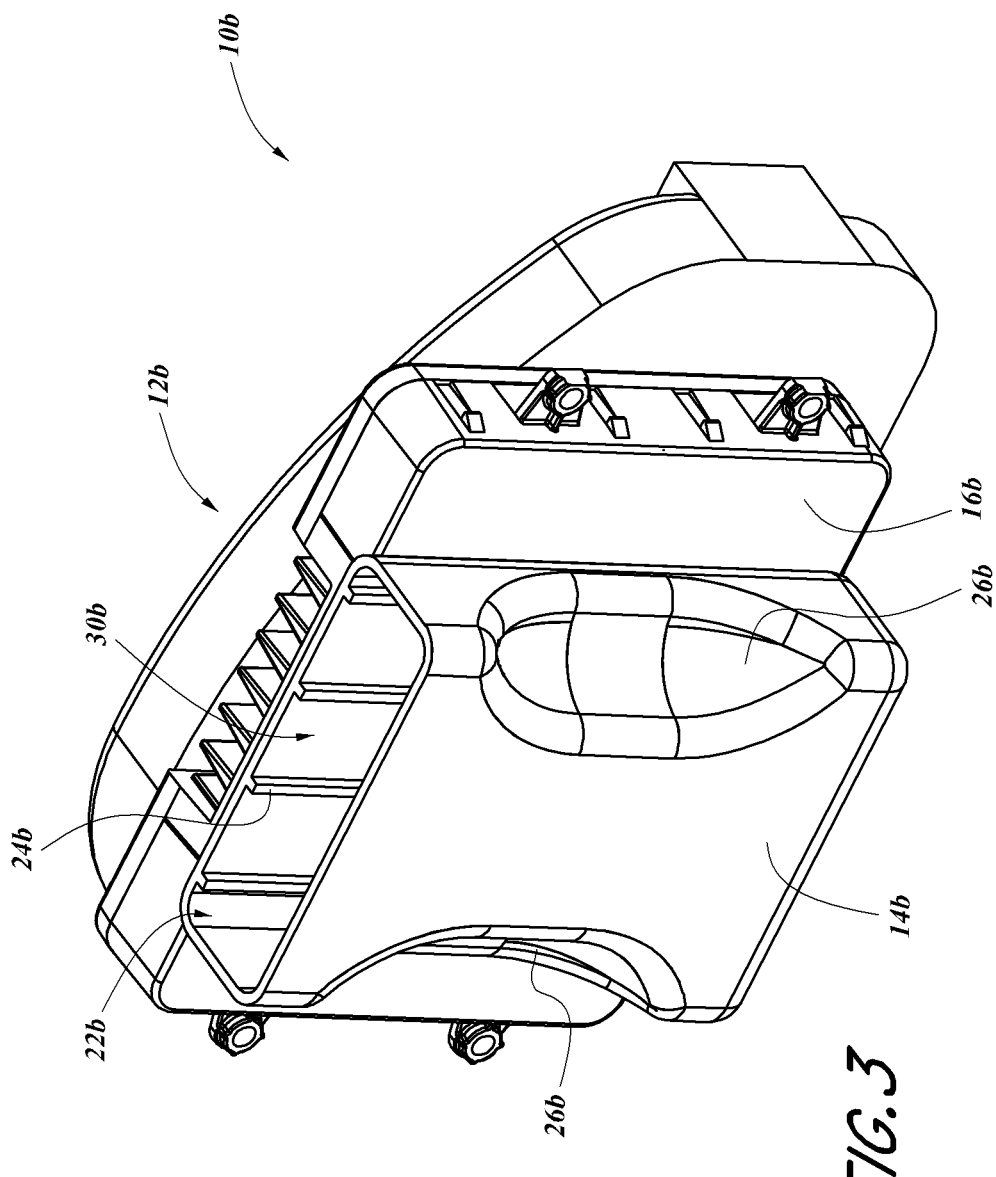
FIG. 3 illustrates a front perspective view of another embodiment of a cooling system for an induction charger comprising a thermal conditioning module connected with an induction charging module, which is connected with a dock.
Figure 3A:
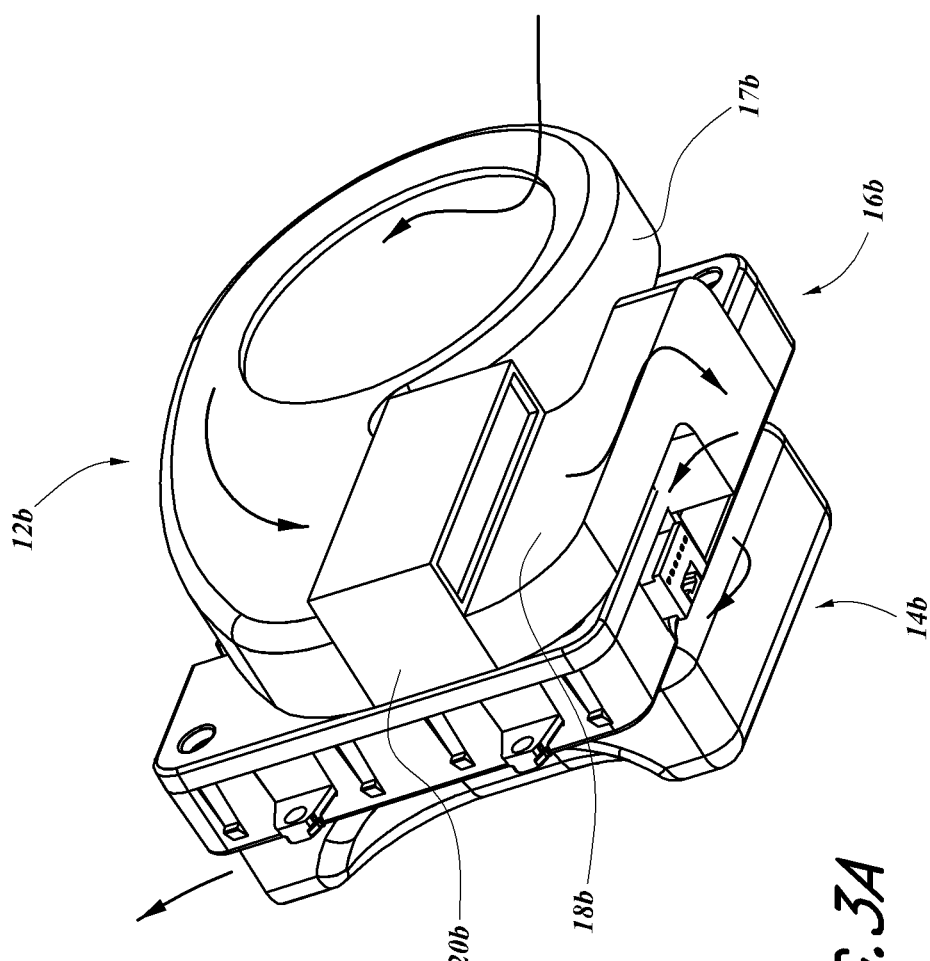
FIG. 3A illustrates a bottom perspective view of the system of FIG. 3.
Figure 3B:
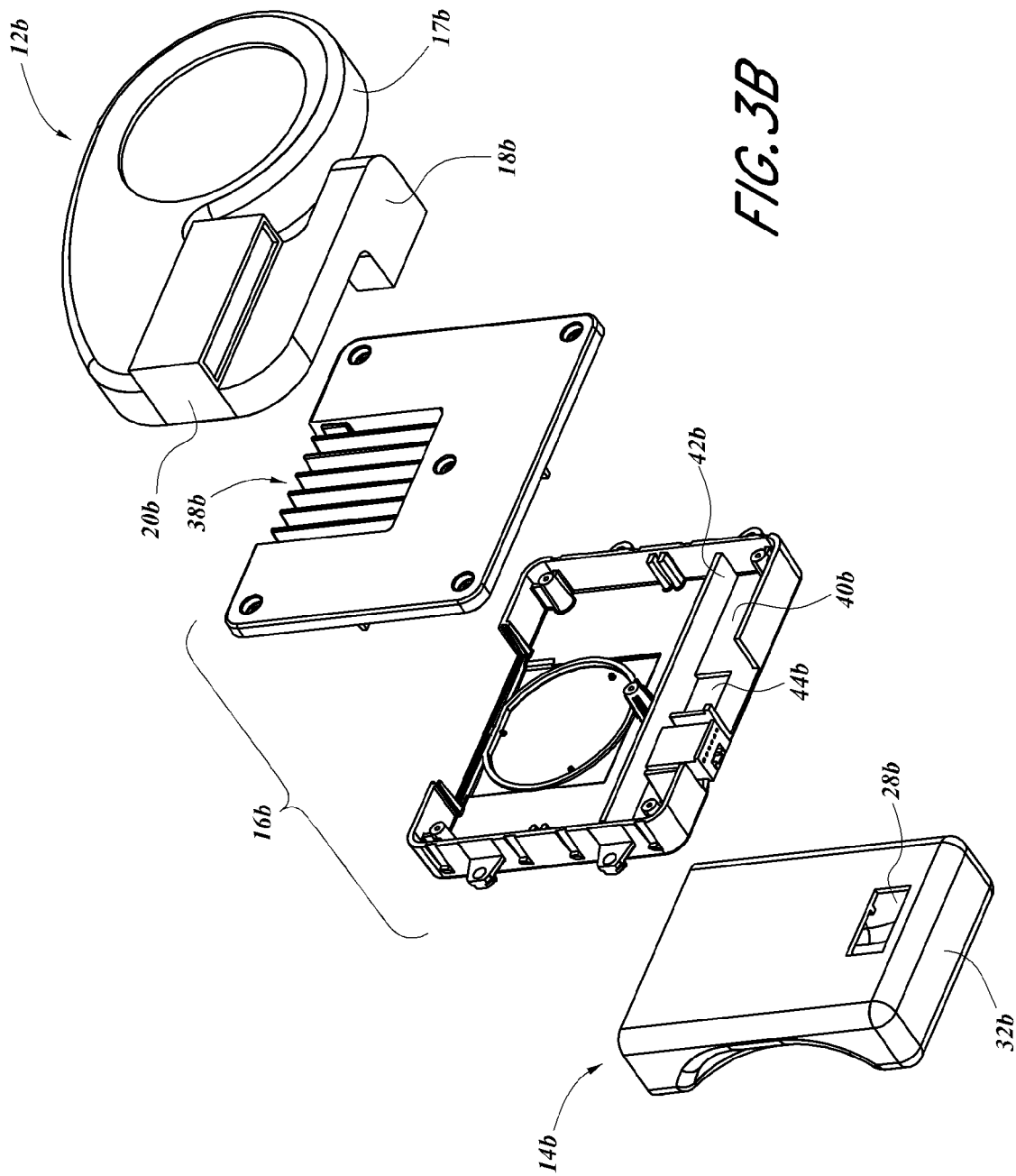
FIG. 3B illustrates an exploded bottom perspective view of the cooling system of FIG. 3A.

FIGS. 3, 3A, and 3B illustrate another embodiment of a cooling system for an induction charger 10b. Several features and components of the cooling system for an induction charger 10b are identical or similar in form and function to those described above with respect to the cooling systems for an induction charger 10, 10a and have been provided with like numerals, with the addition of "b." Any features and/or components of the disclosed embodiments can be combined or used interchangeably.

With continued reference to FIGS. 3, 3A, and 3B, in certain embodiments, air or other fluid is directed through a portion of the induction charging module 16b. As illustrated, the induction charging module 16b can be disposed between the dock 14b and the fan 17b and/or the thermal conditioning device 20b (e.g., TED). Such a configuration can, for example, reduce the space occupied by the system 10b. Further, in certain embodiments, such a configuration can enhance the heat dissipation from the induction charging module 16b. For example, in some embodiments, holes or other openings (not shown) in the ducting 18b direct fluid toward and/or along fins 38b of the induction charging module 16b.

In some embodiments, a duct, coupling or other fluid passage 18b fluidly connects the fluid transfer device 17b (e.g., fan) and with an interior portion 40b of the induction charging module 16b. For example, the interior portion 40b can be configured to receive or mate with the ducting 18b. In certain variants, the interior portion 40b is divided from another portion of the induction charging module 16b by one or more baffles, dividing members and/or other barriers 42b, which can prevent, inhibit or reduce the likelihood of the migration of dirt, dust, other particles, or other undesirable substances from reaching the electronic components of the induction charging module 16b. In some embodiments, such a barrier 42b is configured to direct the flow of fluid, for example, toward a front wall of the induction charging module 16b. As illustrated in FIG. 3B, the interior portion 40b can be positioned in a bottom portion of the induction charging module 16b, but the interior portion can be located in any location, such as, for example, on a side or the top of the induction charging module 16b and/or the like, as desired or required.

The front wall of the induction charging module 16b can include an aperture or other opening 44b that is configured to at least partially align or otherwise coincide with the opening 28b of the dock 14b when the induction charging module 16b and the dock 14b are mounted together. Such a configuration can allow fluid in the interior portion 40b to flow into the dock 14b. Accordingly, during operation of the system 10, and as is shown by the arrows in FIG. 3A, air or other fluid can flow from the fan or other fluid transfer device 17b along and/or through the TED or other thermal conditioning device 20b, thereby thermally conditioning (e.g., cooling and/or dehumidifying) the air in a desired manner. The conditioned air can flow through the ducting 18b into the interior portion 40b, through the aperture 44b and the opening 28b, and ultimately into the dock 14b. As previously discussed, conditioned air can be warmed by, and this its cooling effect at least partially offset, heat generated from the induction charging module 16b and/or the PED. In some embodiments, air exits the dock 14b and enters the vehicle's ambient environment, for example, by flowing through the channels 30b and between the ribs 24b.

Various embodiments of the cooling systems for an induction charger 10, 10a, 10b are configured to operate with an ambient air temperature of less than or equal to about 85° C. In some implementations, the cooling systems for an induction charger 10, 10a, 10b are configured to provide at least about: 4 watts, 5, watts, 6 watts, 7 watts, 8 watts, 9 watts, values in between the foregoing, and/or the like of heat dissipation. In other embodiments, the cooling system is configured to provide less than 4 watts or greater than about 9 watts of heat dissipation. In some embodiments, the cooling systems for an induction charger 10, 10a, 10b are configured to dissipate at least about 4 watts generated by the induction charging module 16, 16a, 16b and at least about 3 watts generated by the PED. In certain embodiments, the cooling systems for an induction charger 10, 10a, 10b are configured to offset at least about: 50%, 60%, 70%, 80%, 85%, 90%, 95%, 99%, 100%, values in between, or otherwise, of the heat generated by the induction charging assembly during induction charging of the portable electronic device. In certain variants, the cooling systems for an induction charger 10, 10a, 10b are configured to offset all or substantially all of the heat generated by the induction charging assembly during induction charging of the portable electronic device. In some implementations, the cooling systems for an induction charger 10, 10a, 10b are configured to offset more than the heat generated by the induction charging assembly during induction charging of the portable electronic device.

For purposes of summarizing the inventions disclosed herein and the advantages achieved over the prior art, certain objects and advantages of the inventions are described herein. Of course, it is to be understood that not necessarily all such objects or advantages need to be achieved in accordance with any particular embodiment. Thus, for example, those skilled in the art will recognize that the inventions may be embodied or carried out in a manner that achieves or optimizes one advantage or group of advantages as taught or suggested herein without necessarily achieving other objects or advantages as may be taught or suggested herein.

As will be apparent, the features and attributes of the specific embodiments disclosed herein may be combined in different ways to form additional embodiments, all of which fall within the scope of the present disclosure.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Many variations and modifications may be made to the herein-described embodiments, the elements of which are to be understood as being among other acceptable examples. All such modifications and variations are intended to be included herein within the scope of this disclosure and protected by the following claims.

What is claimed is:

1. A cooling system for an induction charger, the system comprising:
    a thermal conditioning module in fluid communication with an induction charging assembly comprising an induction charging module, the thermal conditioning module comprising:
    a fan assembly;
    a thermoelectric device; and
    ducting fluidly connecting the fan assembly, the thermoelectric device, and a dock of the induction charging assembly, wherein the dock has a partially-enclosed portion and an aperture at a first end of the dock defining a cavity, the cavity configured to receive and to provide inductive charging functionality to a portable electronic device;

wherein the induction charging module is connected to a first side of the dock and the ducting delivers air to an opening in a second side of the dock opposite the first side, the opening located between the first end of the dock and a second end of the dock opposite the first end such that air flows down at least part of an interior surface of the second side of the dock; and wherein the fan is configured to encourage air across a portion of the thermoelectric device, thereby cooling the air, and the cooled air is subsequently provided to the induction charging assembly, thereby offsetting at least a portion of the heat generated by the induction charging assembly during induction charging of the portable electronic device.

2. The cooling system of claim 1, wherein the system is disposed in an automobile.

3. The cooling system of claim 1, wherein the portable electronic device comprises a cell phone.

4. The cooling system of claim 1, wherein the ducting connects with a bottom of the dock, thereby providing air to the bottom of the dock and the air flowing toward the top of the dock along at least a portion of the portable electronic device.

5. The cooling system of claim 1, wherein the ducting connects with a middle portion the dock, and the air is directed toward the bottom of the dock before flowing toward the top of the dock along at least a portion of the portable electronic device.

6. The cooling system of claim 1, wherein the ducting connects with an induction changing module, and the induction changing module connects with the dock.

7. The cooling system of claim 1, wherein the fan and the thermoelectric device are located in a single housing.

8. The cooling system of claim 1, wherein the system is configured to at least partially offset the heat generated by the induction charging assembly during induction charging of the portable electronic device.

9. The cooling system of claim 1, wherein the system is configured to provide at least about 6 watts of the heat dissipation.

10. A method of cooling an inductive charging assembly in a vehicle, the method comprising:

drawing air into a fan;

providing the air to a thermoelectric device;

reducing the temperature of the air with the thermoelectric device;

providing the air to a dock comprising a partially-enclosed portion and an aperture at a first end of the dock defining a configured to receive a portable electric device, the dock being positioned adjacent to an inductive charging module connected to a first side of the dock that is configured to provide inductive charging capability to the portable electric device received in the dock;

passing the air along a channel of the dock and at least along a portion of the portable electric device, the channel being partially defined by ribs extending into the cavity;

increasing the temperature of the air with heat generated by the inductive charging of the portable electric device; and expelling the air into the ambient interior of the vehicle.

11. The method of claim 10, further comprising securing the portable electric device within the cavity with the ribs.

12. The method of claim 10, wherein the air is provided to the bottom of the dock.

13. The method of claim 10, wherein the air is provided to a middle portion of the dock.

14. The method of claim 10, further comprising providing the air to the inductive charging module prior to providing the air to the dock.

* * * * *